US012677691B2

(12) United States Patent
Zhou et al.

(10) Patent No.: US 12,677,691 B2
(45) Date of Patent: Jul. 7, 2026

(54) ELECTRONIC PACKAGE AND METHOD FOR MANUFACTURING THE SAME

(71) Applicant: NEXPERIA B.V., Nijmegen (NL)

(72) Inventors: Zhou Zhou, Nijmegen (NL); Haibo Fan, Nijmegen (NL); Chi Ho Leung, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 760 days.

(21) Appl. No.: 17/982,619

(22) Filed: Nov. 8, 2022

(65) Prior Publication Data

US 2023/0146666 A1 May 11, 2023

(30) Foreign Application Priority Data

Nov. 8, 2021 (EP) ..................................... 21206912

(51) Int. Cl.
| | |
|---|---|
| *H10W 74/10* | (2026.01) |
| *H10W 70/40* | (2026.01) |
| *H10W 74/01* | (2026.01) |
| *H10W 72/00* | (2026.01) |
| *H10W 90/00* | (2026.01) |

(52) U.S. Cl.
CPC ........ *H10W 74/111* (2026.01); *H10W 70/429* (2026.01); *H10W 74/01* (2026.01); *H10W 72/886* (2026.01); *H10W 90/736* (2026.01); *H10W 90/766* (2026.01)

(58) Field of Classification Search
CPC .................................................. H01L 23/3107
USPC ........................................................ 257/666
See application file for complete search history.

(56) References Cited

U.S. PATENT DOCUMENTS

| | | | | |
|---|---|---|---|---|
| 6,165,819 | A | * 12/2000 | Seki | .................... H01L 21/4835 |
| | | | | 451/39 |
| 2001/0012526 | A1 | 8/2001 | Tandy | |
| 2019/0189542 | A1 | 6/2019 | Bemmerl et al. | |
| 2020/0075440 | A1 | 3/2020 | Majima et al. | |

FOREIGN PATENT DOCUMENTS

| | | | | |
|---|---|---|---|---|
| CN | | 119181647 A | * 12/2024 | ............. H01L 23/31 |

OTHER PUBLICATIONS

Extended European Search Report for corresponding European application EP21206912.4, 14 pages dated May 9, 2022.

* cited by examiner

*Primary Examiner* — Ajay Arora
(74) *Attorney, Agent, or Firm* — Ruggiero McAllister & McMahon LLC

(57) ABSTRACT

An electronic package and method for manufacturing is provided. The package includes an electronic component having a terminal, a solidified molding compound encapsulating the electronic component, a lead including an inner and a mounting portion. The molding compound includes a first recess at or near a perimeter of a bottom surface of the mounting portion, exposing a portion of a bottom surface of the inner portion arranged near the mounting portion, and/or a second recess at the perimeter of the bottom surface of the mounting portion, the second recess exposing a portion of a side surface of the mounting portion extending between the top and the bottom surface of the mounting portion. The package provides more exposed lead space for a larger solder covering area using the first and/or second recess. Thus, solder strain accumulation is reduced or mitigated, and reliability of the electronic package can be enhanced.

19 Claims, 5 Drawing Sheets

ELECTRONIC PACKAGE AND METHOD FOR MANUFACTURING THE SAME

CROSS REFERENCE TO RELATED APPLICATION

This application claims the benefit under 35 U.S.C. § 119(a) of European Application No. 21206912.4 filed Nov. 8, 2021, the contents of which are incorporated by reference herein in their entirety.

BACKGROUND OF THE DISCLOSURE

1. Field of the Disclosure

Aspects of the present disclosure relate to an electronic package and a method for manufacturing the electronic package.

2. Description of the Related Art

Electronic components, such as semiconductor dies, may be arranged inside an electronic package to protect said electronic components from external damages, for example due to mechanical stress. For example, in a moulded electronic package, an electronic component can be partially or fully encapsulated by a solidified moulding compound, thereby protecting said electronic component.

Various types of electronic packages are known. An exemplary electronic package is one based on a panel-level packaging (PLP) technology. Such a package typically comprises a semiconductor die encapsulated by a body of solidified moulding compound. The package further comprises leads that are electrically connected to terminals of the semiconductor die and are arranged such that a bottom surface of a portion of said leads can be mounted to an external surface, such as a printed circuit board (PCB). Moreover, the bottom surface of said portions are aligned with a bottom surface of the body of solidified moulding compound.

An important parameter in determining the reliability of electronic packages is resistance to solder crack, especially for power semiconductor devices. By applying the electronic package under thermo-mechanical endurance tests, including power cycling and thermal cycling, internal stresses and strains occur due to thermal expansion mismatches among different layers. In particular, among the layers, a solder layer by which the electronic package is connected to, for example, a PCB experiences the highest deformation caused by thermal expansion mismatch between solder and PCB. For example, excessive plastic deformation on the solder layer might be produced, which could subsequently result in the initiation and propagation of solder cracking. The solder cracking reduces a reliability of the solder joint between the electronic package and the external surface to which it is mounted.

SUMMARY

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

According to an aspect of the present disclosure, an electronic package is provided. The electronic package comprises an electronic component having a terminal, a body of solidified molding compound that encapsulates the electronic component, and a lead comprising an inner portion and a mounting portion. One end of the inner portion is integrally connected to the mounting portion, and another end of the inner portion is electrically connected to the terminal. Furthermore, a bottom surface of the mounting portion is exposed and is aligned with a bottom surface of the body of solidified molding compound, and a top surface of the mounting portion is covered by said body of solidified molding compound.

The body of solidified molding compound comprises a first recess arranged at or near a perimeter of the bottom surface of the mounting portion, said first recess exposing a portion of a bottom surface of the inner portion arranged near the mounting portion. Additionally, or alternatively, the body of solidified molding compound comprises a second recess at the perimeter of the bottom surface of the mounting portion, said second recess exposing at least a portion of a side surface of the mounting portion extending between the top surface and the bottom surface of the mounting portion. Here, it is noted that the side surface extends between the top surface and the bottom surface of the mounting portion.

The electronic package according to the present disclosure provides more exposing lead space at or near the mounting portion of the lead for a larger solder covering area using the first and/or second recess. As a result, solder strain accumulation can be reduced or mitigated, for example during thermal cycling, and the reliability of the electronic package can be enhanced.

In some embodiments, the first recess and the second recess may together form a contiguous recess. Additionally, or alternatively, the exposed bottom surface of the mounting portion and the exposed portion of the bottom surface of the inner portion may be contiguous. For example, the first recess and second recess may each be arranged directly adjacent to the perimeter of the bottom surface of the mounting portion.

The top surface and the bottom surface of the mounting portion may extend parallel to one another, and the side surface of the mounting portion may extend perpendicularly to said top surface and bottom surface.

In some embodiments, a maximum depth of the first recess and/or the second recess relative to a thickness of the mounting portion, the depth and thickness both being taken in a direction perpendicular to the bottom surface of the mounting portion, may lie in a range between 1%-50%, preferably in a range between 3%-25%, more preferably in a range between 5%-15%.

The second recess may comprise a first recess section, a depth of which is constant along a width of the first recess section in a direction parallel to and away from the bottom surface of the mounting portion, and a second recess section, a depth of which decreases along a width of the second recess section in said direction. In a further embodiment, the first recess section may be directly adjacent to the mounting portion, and the second recess section may be spaced apart from the mounting portion by said first recess section. The Applicant has found the above configuration to be particularly suitable for increasing the resistance to solder crack and improving the reliability of the electronic package.

A width of the first recess and/or the second recess relative to a thickness of the mounting portion, the thickness being taken in a direction perpendicular to the bottom surface of the mounting portion and the depth being taken in a direction parallel to and away from the bottom surface of the mounting portion, may lie in a range between 5%-60%, preferably in a range between 20%-50%, more preferably in a range between 35%-45%.

The above-described ranges for the depth and width of the first and/or second recess may provide particularly useful embodiments which can exhibit a highly increased solder joint reliability. Nevertheless, it is noted that the present disclosure is not limited to these exemplary ranges.

The lead may further comprise a further mounting portion having an exposed top surface and bottom surface, one end thereof being integrally connected to the mounting portion. The further mounting portion may extend away from the mounting portion in a direction parallel to the bottom surface of the mounting portion.

The electronic component may comprise a semiconductor die having a circuit integrated thereon, wherein the terminal is a terminal of said circuit. For example, the electronic component is a power semiconductor device, such as a power diode or power transistor.

The electronic component comprises a plurality of said terminals, and wherein the electronic package comprises a plurality of said leads. Furthermore, the body of solidified molding compound may comprise a plurality of said first recesses and/or second recesses, each corresponding to a respective lead among the plurality of leads. In some embodiments, a first recess and a second recess may be formed for each lead among the plurality of leads to increase the solder joint reliability for each of said leads.

The electronic package may be of a panel level packaging, PLP, type. According to another aspect of the present disclosure, a method for manufacturing an electronic package is provided. The method comprises the step of a) providing an electronic package comprising an electronic component having a terminal, a body of solidified molding compound that encapsulates the electronic component, and a lead comprising an inner portion and a mounting portion, wherein one end of the inner portion is integrally connected to the mounting portion, wherein another end of the inner portion is electrically connected to the terminal, wherein a bottom surface of the mounting portion is exposed and is aligned with a bottom surface of the body of solidified molding compound, and wherein a top surface of the mounting portion is covered by said body of solidified molding compound. The method further comprises a step of b), performed during or after step a), of forming b1) a first recess in the body of solidified molding compound at or near a perimeter of the bottom surface of the mounting portion, said first recess exposing a portion of a bottom surface of the inner portion arranged near the mounting portion, and/or b2) a second recess in the body of solidified molding compound at a perimeter of the bottom surface of the mounting portion, said second recess exposing at least a portion of a side surface of the mounting portion extending between the top surface and the bottom surface of the mounting portion.

Step a) may comprise a step a1) of providing the electronic component and the lead, the lead being electrically connected to the terminal of the electronic component, and a step a2) of applying a molding compound and allowing said molding compound to solidify to thereby form a body of solidified molding compound encapsulating the electronic component and covering at least part of the inner portion and the top surface of the mounting portion, wherein the bottom surface of the body of solidified molding compound is aligned with the bottom surface of the mounting portion.

According to some embodiments, the first recess and/or the second recess may be at least partially formed during step a2) using a molding tool. For example, the first recess and/or the second recess are formed by allowing the molding compound to solidify in a particular shape using the molding tool, said shape including the recess(es). Additionally, or alternatively, the first recess and/or the second recess may be at least partially formed by etching, cutting and/or drilling a respective portion of the body of solidified molding compound.

In some embodiments, the first recess and the second recess may be formed such that they together form a contiguous recess. Additionally, or alternatively, the exposed bottom surface of the mounting portion and the exposed portion of the bottom surface of the inner portion may be contiguous.

The top surface and the bottom surface of the mounting portion may extend parallel to one another, and the side surface of the mounting portion may extend perpendicularly to said top surface and bottom surface.

A maximum depth of the first recess and/or the second recess relative to a thickness of the mounting portion, the depth and thickness both being taken in a direction perpendicular to the bottom surface of the mounting portion, may lie in a range between 1%-50%, preferably in a range between 3%-25%, more preferably in a range between 5%-15%.

The second recess may comprise a first recess section, a depth of which is constant along a width of the first recess section in a direction parallel to and away from the bottom surface of the mounting portion, and a second recess section, a depth of which decreases along a width of the second recess section in said direction. In some embodiments, the first recess section may be directly adjacent to the mounting portion, and the second recess section may be spaced apart from the mounting portion by said first recess section.

A width of the first recess and/or the second recess relative to a thickness of the mounting portion, the thickness being taken in a direction perpendicular to the bottom surface of the mounting portion and the depth being taken in a direction parallel to and away from the bottom surface of the mounting portion, may lie in a range between 5%-60%, preferably in a range between 20%-50%, more preferably in a range between 35%-45%.

The lead may further comprise a further mounting portion having an exposed top surface and bottom surface, one end thereof being integrally connected to the mounting portion. The further mounting portion may extend away from the mounting portion in a direction parallel to the bottom surface of the mounting portion.

The electronic component may comprise a semiconductor die having a circuit integrated thereon, wherein the terminal is a terminal of said circuit.

The electronic component may comprise a plurality of said terminals, and step a) may comprise providing a plurality of said leads. Furthermore, step b) may comprise forming a plurality of said first recesses and/or second recesses, each corresponding to a respective lead among the plurality of leads.

BRIEF DESCRIPTION OF THE DRAWINGS

Next, the present disclosure will be described in more detail with reference to the appended drawings, wherein.

DETAILED DESCRIPTION

Figure 1:
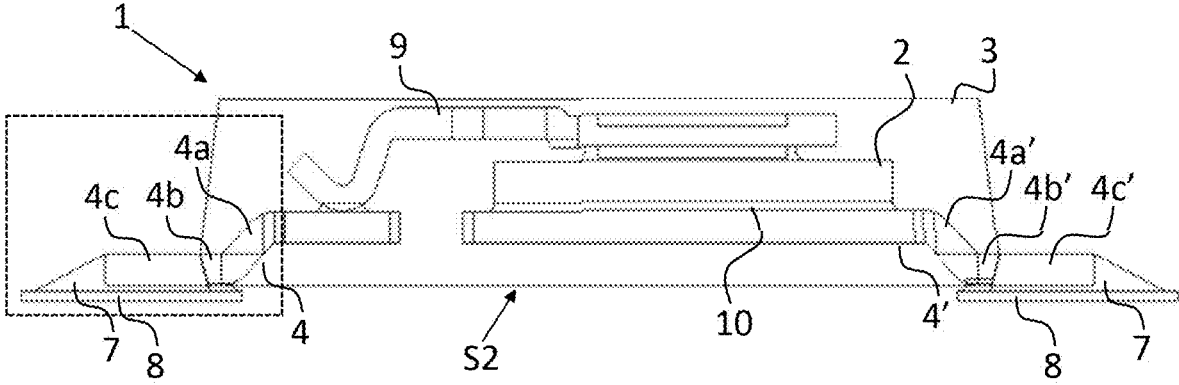
FIG. 1 is an exemplary cross-sectional view of an electronic package according to some embodiments.

The present disclosure is described next in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the detailed description using the singular or plural number may also include the plural or singular number respectively. The word "or" in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

In FIG. 1, a cross-sectional view of an electronic package 1 according to some embodiments is shown. Electronic package 1 comprises an electronic component 2, for example a semiconductor die, that is encapsulated by a body of solidified molding compound 3, such as an epoxy molding compound (EMC).

Electronic component 2 in this embodiment comprises terminals (not shown) that are electrically connected to a portion of respective leads 4, 4'. Such an electrical connection may be formed in various ways, as will be appreciated by a person skilled in the art. For example, a first terminal of electronic component 2 is directly electrically connected to an inner portion 4a' of a lead 4 via a solder layer 10, for example a tin layer, while a second terminal of electronic component 2 is electrically connected to an inner portion 4a of another lead 4' via an intermediate connection 9, such as another lead or one or more bondwires. Furthermore, although only two leads 4, 4' are shown in FIG. 1, corresponding to two terminals of electronic component 2, electronic package 1 may comprise an electronic component with any number of terminals, and may even comprise a plurality of electronic components, each with respective leads for their respective terminals.

Leads 4, 4' of electronic package 1 comprise inner portion 4a, 4a', a mounting portion 4b, 4b' and, optionally, a further mounting portion 4c, 4c', respectively. Here, it is noted that leads 4, 4' of electronic package 1 need not be identical. For example, some or all leads may have different sizes and/or shapes, and some leads may not comprise a further mounting portion.

Hereinafter, for convenience, reference will be made specifically to lead 4. However, it will be appreciated that the present disclosure may similarly apply to one or more other leads of electronic package 1, such as to lead 4' shown in FIG. 1 and/or one or more of any other leads that electronic package 1 may have.

Mounting portion 4b and further mounting portion 4c each have a bottom surface S1 by which electronic package 1 can be mounted to an external surface 8, such as a (conductive) portion of a PCB. Said bottom surface S1 is substantially aligned with a bottom surface S2 of solidified molding compound 3. As such, electronic package 1 may for example correspond to a PLP-type package, such as a surface mount device (SMD). A top surface of mounting portion 4b, arranged opposite to bottom surface S1 of mounting portion 4b, is covered by solidified molding compound 3. On the other hand, further mounting portion 4c extends away from solidified molding compound 3, a top surface thereof being exposed.

Electronic package 1 is shown in FIG. 1 as being mounted to external surface 8 and is shown to be electrically connected thereto via a solder material 7, forming a solder joint between electronic package 1 and external surface 8. To enhance the reliability of the solder joint, for example the solder joint at mounting portion 4b, a recess (not shown in FIG. 1) is formed in solidified molding compound 3 at or near mounting portion 4b, thereby exposing a bottom surface of inner portion 4a. The recess will be described below in more detail with reference to FIGS. 2A and 2B.

Figure 2A:
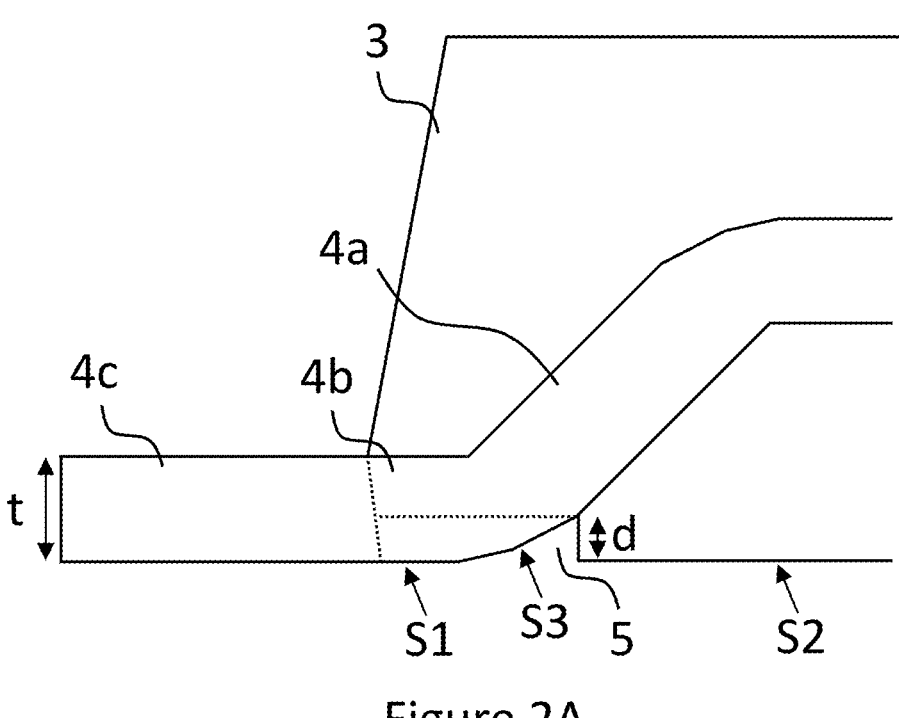
FIGS. 2A and 2B are a side view and bottom view, respectively, of a portion of an electronic package according to some embodiments.
Figure 2B:
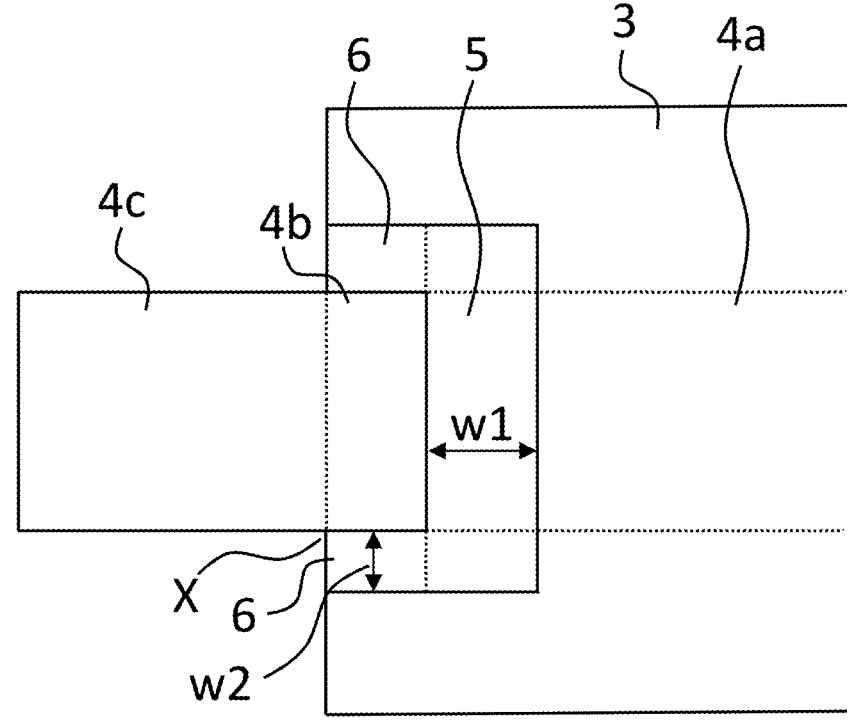

In FIGS. 2A and 2B, a cross-sectional view and bottom view of electronic package 1 is shown, respectively. In particular, the cross-sectional view shown in FIG. 2A corresponds to an enlarged portion of FIG. 1 marked with a dashed line, and elements in the bottom view shown in FIG. 2B are aligned with corresponding elements in the cross-sectional view of FIG. 2A.

FIGS. 2A and 2B show a portion of electronic package 1 including a first recess 5 and a second recess 6 formed in solidified molding compound 3. First recess 5 is formed at a portion of a perimeter of bottom surface S1 and exposes a bottom surface S3 of inner portion 4a. Second recess 6 is formed at a different portion of said perimeter of bottom surface S1 and exposes a side surface (not indicated) of mounting portion 4b. The side surface extends between bottom surface S1 and the top surface of mounting portion 4b.

In FIG. 2B, second recess 6 is shown as being arranged on both of opposing side surfaces of mounting portion 4b. However, the present disclosure is not limited thereto. For example, second recess 6 may be arranged only at one side so as to expose only one side surface of mounting portion 4b.

As shown in FIG. 2B, first recess 5 and second recess 6 may be formed contiguously, for example by removing or omitting a further portion of solidified molding compound 3 in between first recess 5 and second recess 6. In doing so, during soldering of electronic package 1 to external surface 8, solder material can flow freely between first recess 5 and second recess 6, allowing for a better distribution and improved solder joint reliability. Moreover, each of first recess 5 and second recess 6 expose an otherwise covered portion of the lead. The exposed side surface of mounting portion 4b and exposed bottom surface S3 of inner portion 4a enable a complete solder fillet topology surrounding mounting portion 4b, mitigate solder strain accumulation, for example during thermal cycling, and enhance the reliability of electronic package 1.

Although electronic package 1 shown in FIGS. 2A and 2B is shown to comprise both first recess 5 and second recess 6, the present disclosure is not limited to this. Electronic package 1 according to the present disclosure could alternatively comprise only first recess 5, or only second recess 6. In such embodiments, the solder joint reliability can still be enhanced even if only one of first recess 5 and second recess 6 is present.

Next, a manufacturing process of electronic package 1 is described. The manufacturing process may comprise providing the electronic component and a lead frame comprising a plurality of leads 4, 4', as will be appreciated by a person skilled in the art. The leads 4, 4' in lead frame may be shaped by means of bending, for example, and the lead frame may be fixated with respect to electronic component 2. For example, leads 4, 4' may be arranged such that their respective bottom surfaces S1 are aligned to obtain a substantially flat mounting surface by which electronic package 1 is configured to be mounted to an external surface.

The manufacturing method further comprises a molding process of applying a molding compound and allowing said molding compound to solidify to thereby form a body of solidified molding compound 3 encapsulating electronic component 2 and covering at least part of inner portion 4a, 4a' and the top surface of mounting portion 4b. Bottom surface S3 of solidified molding compound 3 is aligned with bottom surface S1 of mounting portion 4b, for example due to the mutually fixated electronic component 2 and the lead frame being arranged on a temporary carrier during the molding process.

First recess 5 and second recess 6 may be at least partially formed after the molding process. That is, first recess 5 and/or second recess 6 may be partially or fully formed by one or more of drilling, etching and cutting after the molding compound has solidified and has formed the body of solidified molding compound 3. As an example only, after the molding process, a laser may be used to remove a portion of solidified molding compound 3 at or near a perimeter of bottom surface S1 of mounting portion 4b.

Alternatively, or additionally, first recess 5 and/or second recess 6 may be at least partially formed during the molding process. For example, first recess 5 and/or v recess 6 may be formed using a corresponding molding tool comprising a temporary structure occupying a space corresponding to said first and/or second recess, which temporary structure is removed after the molding process to thereby form said first and/or second recess. In other words, the molding tool may aid in forming the first recess and/or the second recess by allowing the molding compound to solidify in a particular shape, said shape defining said recess(es).

First recess 5 and second recess 6 need not be formed simultaneously or during the same step in the manufacturing process. For example, first recess 5 may be formed during the molding process, and second recess 6 may be formed after the molding compound has solidified, or vice versa. In another example, first recess 5 is first partially formed using a molding tool, and subsequently, after the molding compound has solidified, using one or more of etching, cutting and drilling, while second recess 6 is fully formed using only the molding tool or only etching, cutting and/or drilling, or vice versa.

First recess 5 and/or second recess 6 may be formed such that a ratio of a depth d of the recess and a thickness t of lead 4 lies in a range between 1%-50%, preferably in a range between 3%-25%, more preferably in a range between 5%-15%. Furthermore, a width w1 of first recess 5 and a width w2 of second recess 6 may be such that a ratio of said width and thickness t of lead 4 lies in a range between 5%-60%, preferably in a range between 20%-50%, more preferably in a range between 35%-45%. As an example, for a lead frame with thickness t of 150 μm, depth d may be roughly 12 μm, and width w1 and width w2 may be roughly 60 μm. Here, it is noted that width w1 and width w2 corresponding to first recess 5 and second recess 6, respectively, need not be identical.

Figures 3A, 3B:
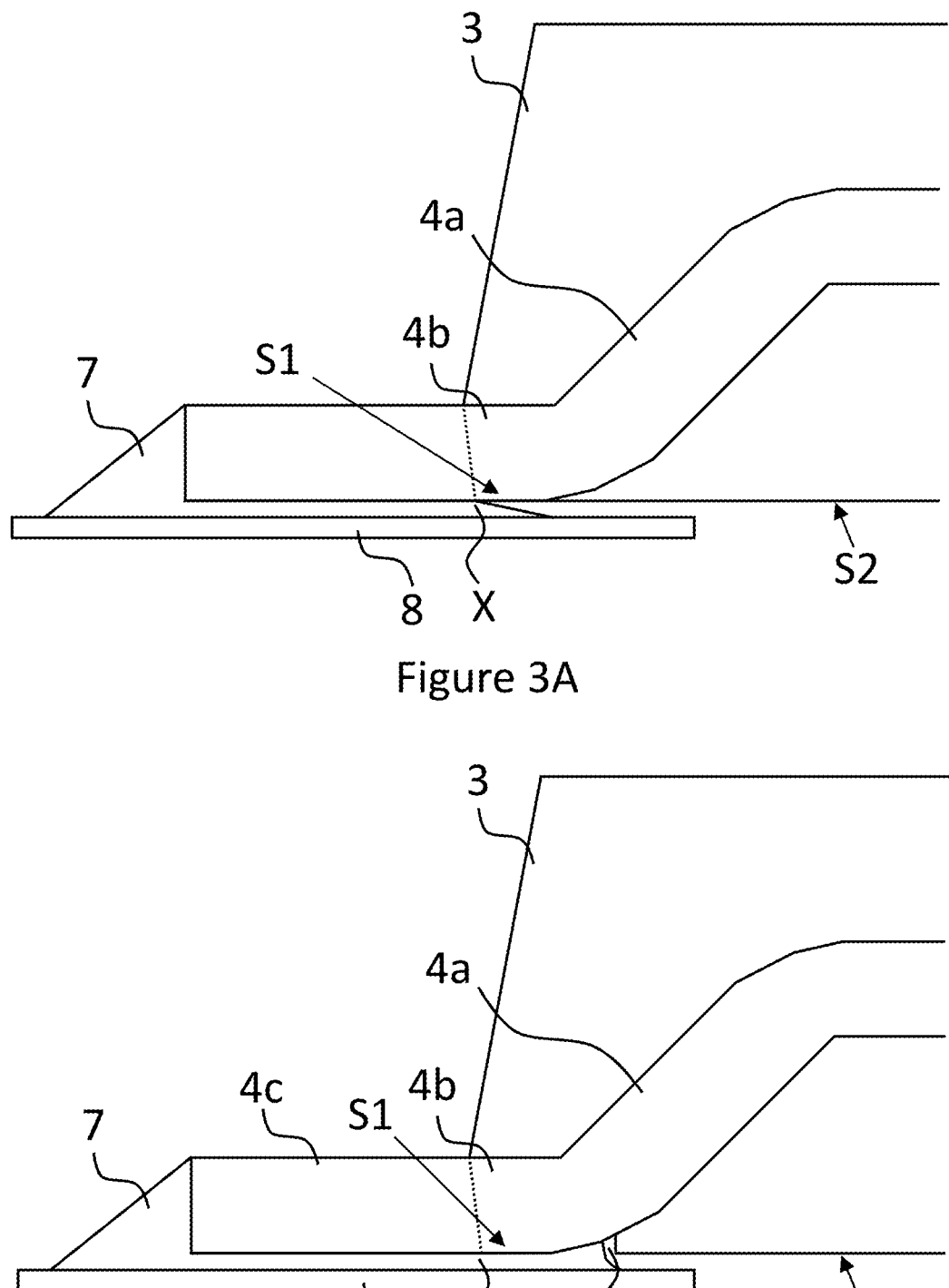
FIGS. 3A and 3B are side views of a portion of an electronic package mounted to an external surface without a recess and with a recess according to the present disclosure, respectively.

In FIGS. 3A and 3B, an exemplary side view of a portion of electronic package 1 mounted to external surface 8 is shown. FIG. 3A shows solder layer 7 and a portion of electronic package 1 without the abovementioned recess and further recess in solidified molding compound 3 and FIG. 3B shows solder layer 7 and a portion of electronic package 1 that does comprise first recess 5 corresponding to mounting portion 4b and inner portion 4a.

As shown in FIG. 3A, without first recess 5 and second recess 6, typically the amount of solder filled formed underneath bottom surface S1 of mounting portion 4b is substantially limited, due to solder wetting being blocked by solidified molding compound 3. Such a configuration may be prone to stress accumulation. On the other hand, by including first recess 5 as shown in FIG. 3B, a solder joint between lead 4 and external surface 8 may be enhanced and may be more resistant to solder crack. Although not shown in the figures, this may similarly apply to second recess 6.

Figure 4A:
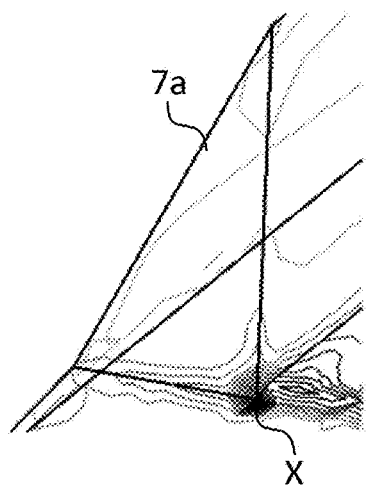
FIGS. 4A and 4B are simulated solder strains of an electronic package without a recess and with a recess according to the present disclosure, respectively.
Figure 4B:
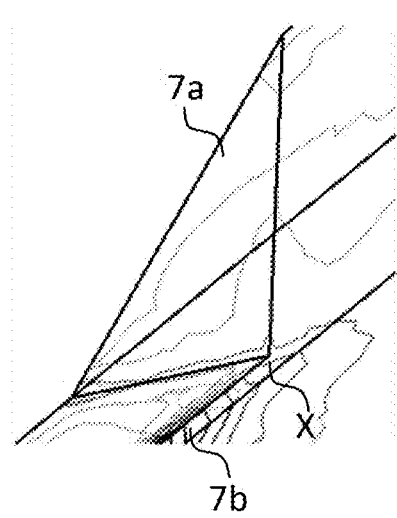

In FIGS. 4A and 4B, a simulated solder strain for solder layer 7 near the mounting portion of a lead is shown respectively for an electronic package excluding the above-mentioned recess(es) and electronic package 1 including first recess 5 and second recess 6. More in particular, constant strain levels are shown using contours in FIGS. 4A and 4B.

For convenience, the corresponding lead is omitted from FIGS. 4A and 4B, and only the solder layer is shown. More in particular, a solder portion 7a may for example be a portion of solder layer 7 arranged at a side surface of further mounting portion 4c shown in FIG. 3B. For reference, a location of region X marked in FIGS. 4A and 4B is also indicated in FIG. 2B and in FIGS. 3A and 3B.

By comparing FIGS. 4A and 4B, it is clear that the accumulated strain that is otherwise concentrated in region X in FIG. 4A is substantially mitigated in FIG. 4B due to the presence of a second recess as described above, in which solder material 7b can be arranged. As a result, the solder joint reliability of electronic package 1 can be enhanced using second recess 6. Although not shown in FIGS. 4A and 4B, this may similarly apply to first recess 5.

Figure 5:
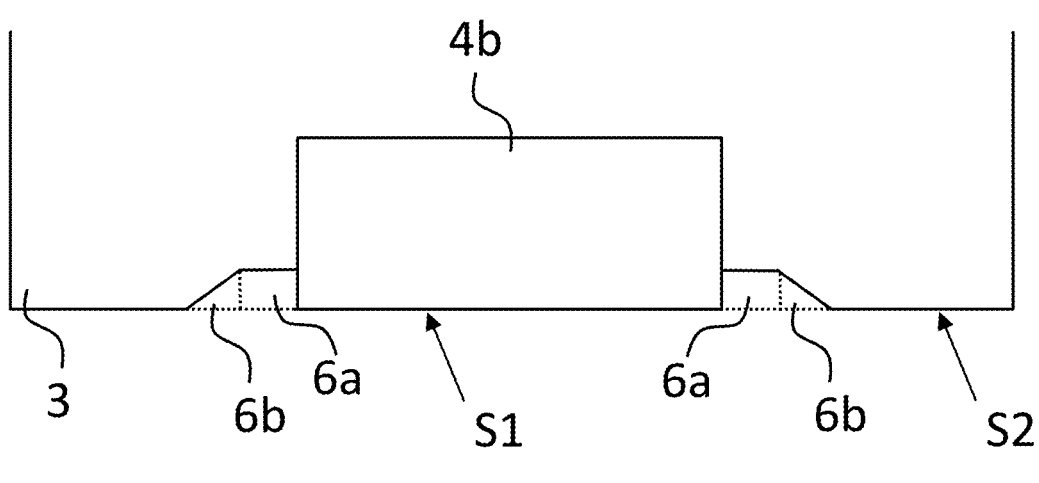
FIGS. 5 and 6 are side views of a portion of an electronic package from different directions, according to some embodiments.

In FIG. 5, a side view of electronic package 1 is shown. The side view shown in FIG. 5 may be a view perpendicular to the view of the cross-section shown in FIG. 2A.

As discussed above, second recess 6 may be arranged at one or both side surfaces of mounting portion 4b. In a further embodiment, as shown in FIG. 5, second recess 6 may comprise a first recess section 6a that has a substantially constant depth with respect to bottom surface S2 of solidified molding compound 3, and a second recess section 6b that has a smaller and/or decreasing depth with respect to said bottom surface S2. A width of second recess section 6b may be greater than or equal to a width of first recess section 6a, though the present disclosure is not limited thereto.

Figure 6:
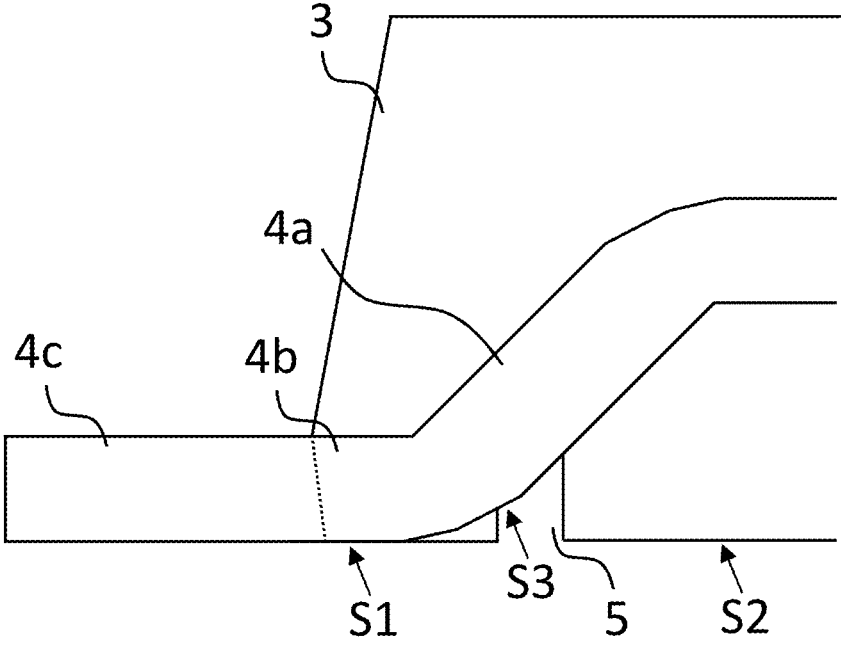

In FIG. 6, a cross-sectional view of a portion of electronic package 1 according to some embodiments is shown. Electronic package 1 shown in FIG. 6 differs from that shown in FIG. 2A in that first recess 5 is arranged near mounting portion 4b but is not directly adjacent thereto. In other words, exposed bottom surface S1 of mounting portion 4b and exposed bottom surface S3 of inner portion 4a are not contiguous due to a portion of the body of solidified molding compound 3 that may be present between first recess 5 and mounting portion 4b. Nevertheless, first recess 5 as shown in FIG. 6, optionally together with second recess 6, may provide an enhanced solder joint reliability. As such, first recess 5 need not be arranged directly adjacent to mounting portion 4b, and may be arranged near said mounting portion 4b instead.

The ensuing description above provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

What is claimed is:

1. An electronic package comprising:
an electronic component having a terminal;
a body of solidified molding compound that encapsulates the electronic component;

a lead comprising an inner portion and a mounting portion, wherein one end of the inner portion is integrally connected to the mounting portion, wherein another end of the inner portion is electrically connected to the terminal;
wherein the mounting portion has a bottom surface that is exposed and is aligned with a bottom surface of the body of solidified molding compound;
wherein the mounting portion has a top surface that is covered by the body of solidified molding compound;
wherein the top surface and the bottom surface of the mounting portion extend parallel to one another, and wherein the mounting portion has a side surface that extends perpendicularly to the top surface and the bottom surface;
wherein the body of solidified molding compound comprises:
a first recess at or near a perimeter of the bottom surface of the mounting portion, the first recess exposing a portion of a bottom surface of the inner portion arranged near the mounting portion; and/or
a second recess at the perimeter of the bottom surface of the mounting portion, the second recess exposing at least a portion of the side surface of the mounting portion extending between the top surface and the bottom surface of the mounting portion.

2. The electronic package according to claim 1, wherein the first recess and the second recess together form a contiguous recess.

3. The electronic package according to claim 1, wherein the exposed bottom surface of the mounting portion and the exposed portion of the bottom surface of the inner portion are contiguous; and/or
wherein the first recess and/or the second recess has a maximum depth relative to a thickness of the mounting portion, the depth and thickness both being taken in a direction perpendicular to the bottom surface of the mounting portion, and lies in a range between 1%-50%.

4. The electronic package according to claim 1, wherein the second recess comprises:
a first recess section having a depth of which is constant along a width of the first recess section in a direction parallel to and away from the bottom surface of the mounting portion;
a second recess section having a depth of which decreases along a width of the second recess section in the direction;
wherein the first recess section is directly adjacent to the mounting portion; and wherein the second recess section is spaced apart from the mounting portion by the first recess section.

5. The electronic package according to claim 1, wherein the first recess and/or the second recess has a width relative to a thickness of the mounting portion, the thickness being taken in a direction perpendicular to the bottom surface of the mounting portion and the depth being taken in a direction parallel to and away from the bottom surface of the mounting portion, and lies in a range between 5%-60%; and/or
wherein the lead further comprises a further mounting portion having an exposed top surface and bottom surface and one end thereof being integrally connected to the mounting portion; and
wherein the further mounting portion extends away from the mounting portion in a direction parallel to the bottom surface of the mounting portion.

6. The electronic package according to claim 1, wherein the electronic component comprises a semiconductor die having a circuit integrated thereon;

wherein the terminal is a terminal of the circuit; and/or wherein the electronic component comprises a plurality of the terminals, wherein the electronic package comprises a plurality of the leads, and wherein the body of solidified molding compound comprises a plurality of the first recesses and/or second recesses, each corresponding to a respective lead among the plurality of leads; and/or wherein the electronic package is of a panel level packaging (PLP) type.

7. A method for manufacturing an electronic package, comprising the steps of:

a) providing an electronic package comprising:

an electronic component having a terminal;

a body of solidified molding compound that encapsulates the electronic component;

a lead comprising an inner portion and a mounting portion;

wherein one end of the inner portion is integrally connected to the mounting portion;

wherein another end of the inner portion is electrically connected to the terminal;

wherein the mounting portion has a bottom surface that is exposed and is aligned with a bottom surface of the body of solidified molding compound; and wherein the mounting portion has a top surface that is covered by the body of solidified molding compound;

wherein the top surface and the bottom surface of the mounting portion extend parallel to one another, and wherein the mounting portion has a side surface that extends perpendicularly to the top surface and the bottom surface; and b) forming, during or after step a):

b1) a first recess in the body of solidified molding compound at or near a perimeter of the bottom surface of the mounting portion, the first recess exposing a portion of a bottom surface of the inner portion arranged near the mounting portion; and/or b2) a second recess in the body of solidified molding compound at a perimeter of the bottom surface of the mounting portion, the second recess exposing at least a portion of a side surface of the mounting portion extending between the top surface and the bottom surface of the mounting portion.

8. The method according to claim 7, wherein step a) comprises:

a1) providing the electronic component and the lead, the lead being electrically connected to the terminal of the electronic component; and a2) applying a molding compound and allowing the molding compound to solidify to form a body of solidified molding compound encapsulating the electronic component and to cover at least part of the inner portion and the top surface of the mounting portion, wherein the bottom surface of the body of solidified molding compound is aligned with the bottom surface of the mounting portion.

9. The method according to claim 8, wherein the first recess and/or the second recess is at least partially formed during step a2) using a molding tool.

10. The method according to claim 7, wherein the first recess and/or the second recess is at least partially formed by a method selected from the group consisting of: etching, cutting, and drilling, a portion of the body of solidified molding compound.

11. The method according to claim 7, wherein the first recess and the second recess are formed so that they together form a contiguous recess.

12. The method according to claim 7, wherein the exposed bottom surface of the mounting portion and the exposed portion of the bottom surface of the inner portion are contiguous; and/or wherein the first recess and/or the second recess have a maximum depth relative to a thickness of the mounting portion, the depth and thickness both being taken in a direction perpendicular to the bottom surface of the mounting portion, and lies in a range between 1%-50%.

13. The method according to claim 7, wherein the second recess comprises:

a first recess section, having a depth which is constant along a width of the first recess section in a direction parallel to and away from the bottom surface of the mounting portion; and a second recess section, having a depth which decreases along a width of the second recess section in the direction;

wherein the first recess section is directly adjacent to the mounting portion; and wherein the second recess section is spaced apart from the mounting portion by the first recess section.

14. The method according to claim 7, wherein the first recess and/or the second recess have a width relative to a thickness of the mounting portion, the thickness being taken in a direction perpendicular to the bottom surface of the mounting portion and the depth being taken in a direction parallel to and away from the bottom surface of the mounting portion, and lies in a range between 5%-60%; and/or wherein the lead further comprises a further mounting portion having an exposed top surface and bottom surface, one end thereof being integrally connected to the mounting portion, wherein the further mounting portion extends away from the mounting portion in a direction parallel to the bottom surface of the mounting portion.

15. The method according to claim 7, wherein the electronic component comprises a semiconductor die having a circuit integrated thereon;

wherein the terminal is a terminal of the circuit; and/or wherein the electronic component comprises a plurality of the terminals, wherein step a) comprises providing a plurality of the leads, and wherein step b) comprises forming a plurality of the first recesses and/or second recesses, each corresponding to a respective lead among the plurality of leads; and/or wherein the electronic package is of a panel level packaging (PLP) type.

16. The method according to claim 7, wherein the exposed bottom surface of the mounting portion and the exposed portion of the bottom surface of the inner portion are contiguous; and/or wherein the top surface and the bottom surface of the mounting portion extend parallel to one another, and wherein the side surface of the mounting portion extends perpendicularly to the top surface and bottom surface; and/or wherein the first recess and/or the second recess have a maximum depth relative to a thickness of the mounting portion, the depth and thickness both being taken in a direction perpendicular to the bottom surface of the mounting portion, and lies in a range between 3%-25%.

17. The method according to claim 7, wherein the exposed bottom surface of the mounting portion and the exposed portion of the bottom surface of the inner portion are contiguous; and/or wherein the top surface and the bottom surface of the mounting portion extend parallel to one another, and wherein the side surface of the mounting portion extends perpendicularly to the top surface and bottom surface; and/or wherein the first recess and/or the second recess have a maximum depth relative to a thickness of the mounting portion, the depth and thickness both being taken in a direction perpendicular to the bottom surface of the mounting portion and lies in a range between 5%-15%.

18. The method according to claim 7, wherein the first recess and/or the second recess have a width relative to a thickness of the mounting portion, the thickness being taken in a direction perpendicular to the bottom surface of the mounting portion and the depth being taken in a direction parallel to and away from the bottom surface of the mounting portion, and lies in a range between 20%-50%; and/or wherein the lead further comprises a further mounting portion having an exposed top surface and bottom surface, one end thereof being integrally connected to the mounting portion, wherein the further mounting portion extends away from the mounting portion in a direction parallel to the bottom surface of the mounting portion.

19. The method according to claim 7, wherein the first recess and/or the second recess have a width relative to a thickness of the mounting portion, the thickness being taken in a direction perpendicular to the bottom surface of the mounting portion and the depth being taken in a direction parallel to and away from the bottom surface of the mounting portion, and lies in a range between 35%-45%; and/or wherein the lead further comprises a further mounting portion having an exposed top surface and bottom surface, one end thereof being integrally connected to the mounting portion, wherein the further mounting portion extends away from the mounting portion in a direction parallel to the bottom surface of the mounting portion.

\* \* \* \* \*